United States Patent
Jain et al.

(10) Patent No.: US 7,802,165 B2
(45) Date of Patent: Sep. 21, 2010

(54) DECODER SYSTEM FOR DATA ENCODED WITH INTERLEAVING AND REDUNDANCY CODING

(75) Inventors: Raj Kumar Jain, Singapore (SG); Ravindra Singh, Singapore (SG); Hak Keong Sim, Singapore (SG)

(73) Assignee: Lantiq Deutschland GmbH, Neubiberg (DE)

( * ) Notice: Subject to any disclaimer, the term of this patent is extended or adjusted under 35 U.S.C. 154(b) by 1037 days.

(21) Appl. No.: 11/506,051

(22) Filed: Aug. 17, 2006

(65) Prior Publication Data

US 2008/0065968 A1   Mar. 13, 2008

(51) Int. Cl.
*H03M 13/00* (2006.01)
(52) U.S. Cl. .................. 714/755; 714/784; 714/795
(58) Field of Classification Search .......... 714/755, 714/784, 786, 795
See application file for complete search history.

(56) References Cited

U.S. PATENT DOCUMENTS

| 5,691,995 | A  | * | 11/1997 | Ikeda et al. | ............... 714/786 |
| 2005/0102600 | A1 | * | 5/2005 | Anandakumar | ............ 714/755 |
| 2006/0083324 | A1 |  | 4/2006 | DesJardins et al. | |

* cited by examiner

*Primary Examiner*—Fritz Alphonse
(74) *Attorney, Agent, or Firm*—SpryIP, LLC

(57) ABSTRACT

Systems and methods for processing data signals are described. In one implementation, a demodulator and a first decoder unit, such as a convolutional encoder or a quadrature amplitude modulation decoder, for receiving the output of the demodulator, decoding the second level of encoding and outputting a decoded signal and a first error indication signal indicative of errors in the decoded signal are provided. The decoded signal may be passed through a de-interleaving unit to form a de-interleaved signal. The first location signal may be passed to an identifier unit which receives it, and from it produces a second error indication signal indicative of the errors in the de-interleaved signal. The de-interleaved signal and the second error indication signal may be transmitted to a redundancy decoder, where the signals may be used to perform redundancy decoding.

38 Claims, 8 Drawing Sheets

DECODER SYSTEM FOR DATA ENCODED WITH INTERLEAVING AND REDUNDANCY CODING

PRIORITY CLAIM

This application is related to U.S. patent application Ser. No. 11/506,052 entitled "System for impulse noise and radio frequency interference detection", filed on the same day as the present application, and sharing all inventors with the present application, the contents of which are incorporated by reference in its entirety herein.

BACKGROUND

1. Technical Field

The present invention relates generally to a system for extracting data from an encoded signal transmitted over a noisy signal transmission path, for example a digital subscriber line (DSL). In particular, the invention relates to extracting data from a signal encoded using interleaving and redundancy encoding.

2. Background Information

Many protocols exist for transmitting data over a noisy signal transmission path. Four common techniques employed by these protocols are convolutional encoding, quadrature amplitude modulation (QAM) encoding, interleaving and redundancy encoding.

A convolutional encoder encodes each bit of a data string as a function of the last k bits received, where k is referred to as the constraint length. The convolved data can be decoded, following transmission over the transmission line, using a Viterbi decoder. One form of convolutional encoding is trellis coded modulation (TCM). TCM is ideal to protect against Gaussian noise, but it cannot correct errors due to impulse noise.

A QAM encoder modulates the respective amplitudes of two waves having the same frequency and which are in quadrature (i.e. phase apart), and transmits the sum of the modulated waves. The modulation is performed based on data to be encoded. The modulation typically involves setting each amplitude to one of a predefined set of amplitude values. The resultant wave is described by a constellation diagram, in which each axis of the diagram represents the amplitude of a respective one of the waves following the modulation. The encoded data thus determines which point in the constellation diagram describes the sum of the modulated waves. The resultant waveform (corresponding to one point of the constellation diagram) is referred to as a "carrier symbol". The decoder receives the transmitted waves, identifies the corresponding point in the constellation diagram, and thereby reconstructs the data.

In redundancy encoding, a first data string having a certain number of bits is transformed into a second data string having a larger number of bits. For example, the second data string may simply be the first data string plus a number of parity bits. The second data string is transmitted over the signal path, and even though it is received with noise, due to the redundancy in the second data string, the first data string can be reconstructed perfectly, provided that the noise is below a critical level. One common technique for redundancy encoding is Reed-Solomon (RS) encoding. A number of data bytes K is transformed into RS coded codeword of N bytes. R is the number of parity bytes added to the data bytes to form the Reed Solomon code, hence $$N = K + R \tag{1}$$

Suppose that the received codeword includes t errors at unknown positions, and f bytes at known positions (so-called "erasures") which have 50% chance of being errors. A known RS decoder can obtain the correct K bytes, provided that $$2t + f \leq R \tag{2}$$

where R can take any of the values 0, 2, 4, 6, 8, 10, 12, 14, 16. That is, the number of errors which can be present in the second data string without preventing the first data string from being recovered, is twice as high in the case that the location of the errors is known.

To take an example, RS encoding is used by the very high bit rate DSL (VDSL) protocol to encode data which will be transmitted over a DSL using discrete multi-tones (DMT) transmission. Suppose that lr is the line rate including overhead in Mbps, and that S is the number of Reed Solomon codewords in one DMT symbol (a "DMT symbol" consists of an amplitude/phase value (i.e. one carrier signal) for each of the tones). Suppose that the DMT symbol rate is 4 kHz (in fact, in VDSL the symbol rate varies according to a "cyclic extension" which appends to the end of each symbol some data from the beginning; according to the size of the cyclic extension the DMT symbol rate ranges from 3.49 kHz to 4.18 kHz). This gives:

$$S = \frac{250 lr}{8N}. \tag{3}$$

Interleaving means that a first datastring is transformed into a second data string by re-ordering. The second data string is transmitted over the transmission path. Following the transmission, the first datastring is reconstructed by de-interleaving, which reverses the re-ordering process. If the transmission path includes a noise impulse which corrupts a number of successive bits in the second data string, this noise is distributed over the first data string by the re-ordering process. In particular, interleaving may be combined with RS encoding to ensure that errors are spread over a number of RS codewords.

For example, the interleaver adopted for the protocol VDSL2 is defined by the following rule. Each of I bytes in an interleaver block B0B1 . . . . BI−1 is delayed by an amount that varies linearly with the byte index. This results in a relationship between the input and output given by y(n+Δ[j])= x(n), where j=n mod I, y(n) is defined as the interleaver output and x(n) is the interleaver input with the sequence number n. More precisely, byte Bj (with index j) is delayed by:

$$\Delta[j] = (D-1) \times j \text{ bytes} \tag{4}$$

where j=0, 1, 2 . . . , I−1, D=MI+1 is the interleaver depth in bytes, I is the interleaver block size in bytes and M is an interleaving depth parameter and D and I are co-prime (i.e. have no common divisor except for 1).

The RS codeword length N is an integer multiple of I, and N=q×I, where q is an integer between 1 and 8 inclusive. All values of q are supported. Codewords are mapped to interleaver blocks such that the first I bytes of the codeword map to the I bytes B0B1 . . . BI−1 of the first interleaver block.

FIG. 1 is a representation of the effect of equation (4) in the case of I=7. I parallel branches (numbered 0 . . . I−1) are implemented with a delay increment of M octets per branch. The interleaver is represented by the left-hand triangular array of boxes each marked M. Each box represents a delay of MI. Thus, the top channel (i.e. the channel along which B0 passes) includes no delay, the next channel a delay of M, the next channel a delay of 2MI, etc. The j-th branch includes a FIFO shift register (delay line) with length j×MI bytes.

The deinterleaver is represented by the right-hand triangular array of boxes. It is similar to the interleaver, but the branch indices are reversed so that the largest interleaver delay corresponds to the smallest deinterleaver delay. Deinterleaver synchronization is achieved by routing the first byte of an interleaved block of I bytes into branch 0.

The total delay of the interleaver/de-interleaver is:

$$(\check{D}1) \times (\check{I}1) = MI(I-1) \text{ in bytes.} \quad (5)$$

The interleaver depth is set to meet the requirements for the impulse noise protection and the latency. At any data rate, the minimum latency occurs when the interleaver is turned off.

Denoting the number of bits extracted from the interleaver for each DMT Symbol by Lp, $$S = \frac{L_p}{8N}. \quad (6)$$

The impulse noise protection (INP) is $$INP = \lfloor (t/2+f)/q \rfloor D \text{ bytes} \quad (7)$$

where t is the error correction capability and f is the erasure decoding capability of RS Coder which together have to satisfy the condition mentioned in equation (2). From equation (7), it can be seen the providing erasure decoding would provide more impulse noise protection without increasing the interleaver delay. However, in fact DSL decoder devices rarely make use of erasure correction because the location of the errors in the received data is rarely known.

US2006/0083324 describes a multi-carrier communication system, such as a DSL based-network, which transmits frames using QAM and convolutional encoding. Frames carry data and some error check bytes for each of a plurality of bit groups in the frame. Following QAM and Trellis decoding, a corrupted frame detector the error check bytes to identify any bytes within the frame which are liable to be erroneous. For each frame of N-bytes, the corrupted frame detector generates an N-byte array containing N decoded bytes and an N-bit array containing a one-bit flag for each of the respective bytes in the N-byte array, indicating whether that byte is suspected of being corrupt. The two sorts of array are passed to respective de-interleaver units. A first (conventional) de-interleaver de-interleaves the N-byte arrays, and an additional de-interleaver de-interleaves the N-bit arrays. The first de-interleaver produces de-interleaved codewords which are then used for RS decoding using the de-interleaved flags to indicate which bytes of the codeword are potentially corrupt. Since the interleaving combines many frames, the de-interleaver units each have to access data from many frames at once. Suppose that the symbols each contain 4 KB of data, a conventional de-interleaver may typically be required to store about 128 KB of data. The additional de-interleaver described in US2006/0083324 would require a memory which stores one bit for every byte stored in the memory of the first de-interleaver, and thus the total de-interleaver memory requirement is increased by 12.5%. This would significantly add to the cost of the device. In another embodiment, the device of US2006/0083324 obtains the corrupt bytes as part of the QAM decoding process instead of using the error check bytes.

BRIEF SUMMARY

The present invention aims to provide a new and useful system for decoding a signal received over a noisy data communication path.

The invention is applicable to processing of a data signal formed by encoding a first data string by redundancy encoding, interleaving the encoded data string, performing a second level of encoding on the interleaved data string to form an encoded signal, using the encoded signal to modulate a wave, and then transmitting the modulated wave over a data communication path.

In general terms, the present invention proposes that the decoder system includes a first decoder unit for receiving the data signal, decoding the second level of encoding and outputting a decoded signal and a first error indication signal indicative of the errors in the decoded signal. The decoded signal is passed through a de-interleaving unit to form a de-interleaved signal. The first error indication signal is passed to an identifier unit which receives it, and from it produces a second error indication signal indicative of the errors in the de-interleaved signal. The de-interleaved signal and the second location signal are transmitted to a redundancy decoder which employs them to perform redundancy decoding.

Since the redundancy decoder receives information about errors in the de-interleaved signal, it is able to perform the redundancy decoding making use of this information. As indicated by Eqn. (2), this means the total number of errors which can be present in the received data string while still permitting the first data string to be recovered is higher than if the decoder did not have access to the second error indication signal. Thus, the present invention may make it possible, for example, for the data transmission to be performed over noisier data transmission paths. From an alternative point of view, the invention may make it possible for the data transmission rate along a given data transmission path to be higher.

The second level of encoding may comprise convolutional encoding, and in this case the first decoder unit may be a de-convolution decoder. It may, for example, be a Viterbi decoder. Alternatively or additionally, the second level of encoding may comprise QAM encoding.

The first error indication signal may comprise flag values indicative of errors in corresponding portions of the decoded signal (e.g. one flag value for each symbol). The second error indication may comprise second flag values indicative of error in associated portions of the de-interleaved signal (e.g. one second flag value for each byte of a codeword). Each second flag value is equal to the flag value of the portion of the decoded signal from which the associated portion of the de-interleaved signal was obtained. For example, if the redundancy decoder receives a set of bytes forming a codeword, it may similarly receive a respective set of second flag values. Each second flag value is equal to the flag value of the symbol from which the corresponding byte of the codeword was obtained.

Conveniently, the identifier unit may have an engine for obtaining the bytes of the de-interleaved signal which are obtained from any given symbol. This means that, in contrast to US2006/0083324, no second de-interleaver as such may be required. Instead, the identifier unit may have an engine for identifying within the de-interleaved signal the bytes which are obtained from a given symbol, and associating those bytes with the flag value for that symbol. Thus, in contrast to US2006/0083324 the memory requirement of an embodiment of the present invention may be less: the 12.5% increased memory requirement suggested by US2006/0083324 is replaced with an additional memory requirement which may typically be about 20-40 bytes.

The flag values in the present invention may optionally be permitted to take more than two values, such as a value specified by at least two bits, or even a byte or more, of data. The various values may indicate respective levels of belief that the respective component of the decoded data is corrupted. This is in contrast to US2006/0083324 in which the bits of the N-bit string take binary values. The use of more informative flag values is not proposed in US2006/0083324, and is hardly compatible with the mechanism of US2006/0083324 since the additional de-interleaver unit proposed by US2006/0083324 would then have yet higher memory requirements.

BRIEF DESCRIPTION OF THE DRAWINGS

Features of the invention will now be described, for the sake of illustration only, with reference to the following figures in which.

DETAILED DESCRIPTION

1. Overview

Figure 1:
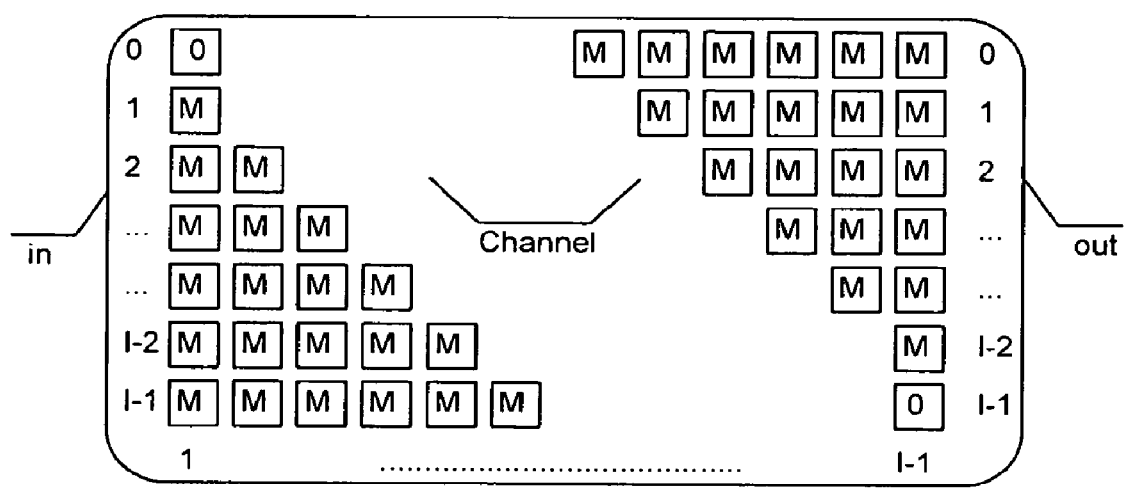
FIG. 1 shows schematically a known interleaver-deinterleaver system.
Figure 2:
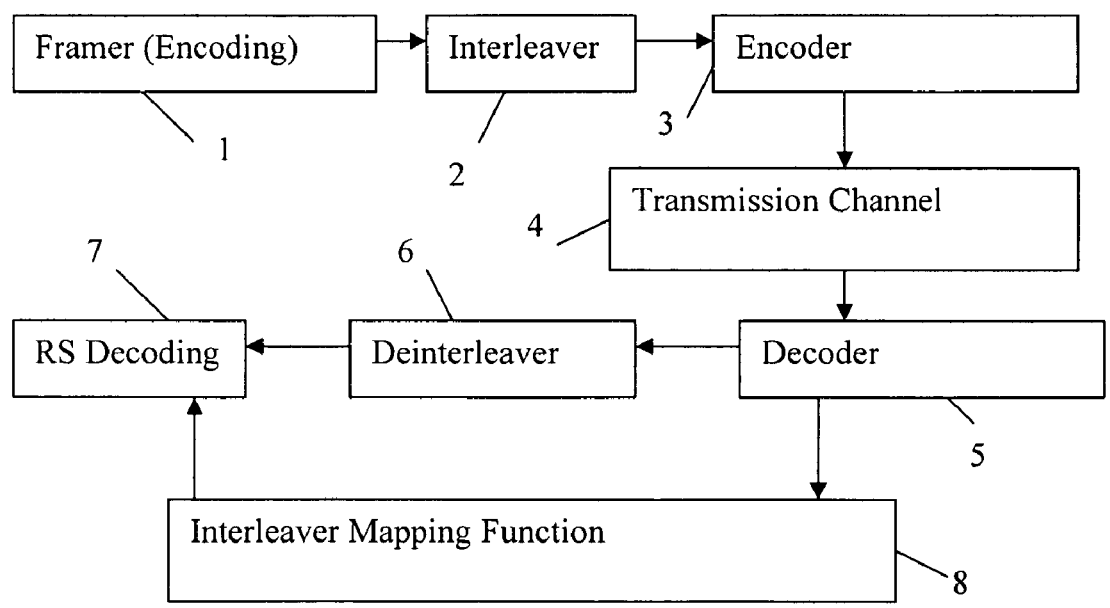
FIG. 2 is a schematic block diagram of a decoder system.

Referring to FIG. 2, an embodiment of the invention is shown. The encoding of the data is performed as in a conventional system by a framer 1 which generates codewords encoded by RS encoding, an interleaver 2 which interleaves the data output by the framer 1, and an encoder 3. The interleaver 2 may be of the conventional form described earlier with reference to FIG. 1. The encoder 3 may be a QAM encoder, or a unit (such as a TCM encoder) which combines convolutional encoding as a first encoding and then QAM to perform a second encoding. In either case, the encoded data is transmitted along a DSL 4, or other data communication path such as a wireless path.

The data received from the DSL 4 after transmission is forwarded to a decoder 5. As in a conventional system, the decoder 5 may be a QAM decoder, or a unit combining Viterbi decoder and QAM decoding. The decoder 5 attempts to reconstruct the symbols input to the encoder 3. In the case that the encoder 3 uses QAM encoding the decoder 5 uses QAM decoding. In the case that the encoder 3 uses TCM which includes QAM encoding, the decoder 6 uses QAM decoding followed by Viterbi decoding.

The reconstructed carrier symbols are output by the decoder 5 to a de-interleaver 6. The de-interleaver 6 may be of the conventional form described earlier with reference to FIG. 1. It produces de-interleaved data, which is transmitted to an RS decoder unit 7. So far, all of this description is in accordance with a known system.

However, in contrast to a known system, the decoder 5 further outputs to an identifier unit 8 data indicating which of these carrier symbols are likely to be erroneous. For example, the decoder 5 may indicate that a whole DMT symbol may be corrupt. The identifier unit 8 processes the addresses of the bytes in the corrupt DMT symbol(s) to form address data which indicates the addresses of bytes in the de-interleaved data output by the unit 6. This address data is input to the RS decoder unit 7, so that the RS decoder unit 7 is enabled to perform erasure decoding, e.g. according to known techniques.

In the case that an erroneous byte is identified, the RS decoder neglects that byte in the output it receives from the de-interleaver 6. In other words, that byte is treated as erased. The RS decoder 7 does not need an estimate of the value of such bytes.

Whereas in the discussion above the identifier unit 8 is effectively sent a binary value indicative of corruption (e.g. a data indicating whether each given symbol is corrupt or not), the invention is not limited in this respect. Alternatively, the decoder 5 may output a flag value in respect of each symbol for example, and this symbol may take one of more than two possible values. For example, it may be a signal value specified by a byte of data. The identifier unit 8 passes these flag values to the RS decoder 7 such that when the RS decoder 7 receives a codeword of data comprising a set of bytes it simultaneously receives a set of flag values. Each of the set of flag values corresponds to one byte of the codeword, and is equal to the flag value of the symbol from which that byte was derived.

The way the decoder 5 identifies corruption in the data it outputs and what action it takes depends upon whether the encoder 3 uses QAM encoding (in which case the decoder 5 identifies corruption as part of its QAM decoding process) or whether the encoder 3 uses convolutional encoding (in which case the decoder 5 identifies corruption as part of its Viterbi algorithm). In the case that the encoder 3 uses both convolutional encoding and QAM encoding, so that the decoder 5 uses QAM decoding followed by convolutional decoding using the Viterbi algorithm, the QAM decoding portion of the decoder 5 may not attempt to identify whether there has been corruption. Instead, it may rely on the Viterbi algorithm to identify, and if possible correct, any error.

2. Operation of the Decoder 5

2.1 Operation of the Decoder 5 when the Encoder 3 Performs QAM Modulation

When the encoder 3 applies QAM modulation and the decoder 5 applies QAM decoding, each carrier symbol produced by the encoder 3 is one point of a constellation. The decoder 5 knows the constellation to which the carrier symbol belongs, but not which point in the constellation it is. In a DMT system, there can be a different constellation for each tone (carrier symbol).

Figure 3A:
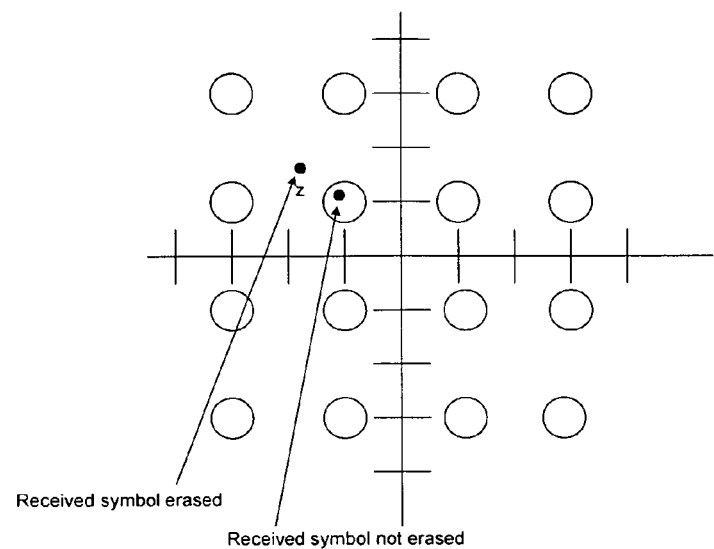
FIGS. 3(a) and 3(b) illustrate operations performed by different respective versions of the decoder system of FIG. 2.

For example, FIG. 3(a) shows a 16-QAM constellation, in which each of the two quadrature waves is modulated to take one of four possible amplitude values, so that the constellation includes 16 points in total.

As in a conventional QAM decoder, to obtain an estimate of what data the encoder 3 intended to encode in a given carrier signal, the decoder 5 identifies which point of the corresponding constellation is closest to the received carrier symbol.

In contrast to a conventional QAM decoder, to evaluate whether this carrier symbol is corrupted or not corrupted, the decoder 5 calculates the Euclidean distance between the identified point of the constellation and the corresponding carrier signal. It determines whether this distance is above or below a predetermined threshold, and accordingly determines that the symbol is or is not corrupted.

This is illustrated in FIG. 3(a) by the circles which are drawn around each of the 16 constellation points. The radius of the circles is $5\sigma$, where $\sigma$ is variance of Additive white Gaussian noise (AWGN). If the received symbol is inside one of the circles of radius $5\sigma$, the receiver knows with very high probability that no error has occurred, since the probability that the (background and crosstalk) noise vector added to the transmitted carrier symbol brings it to another circle of radius $5\sigma$ is very small. This is because the Bit Error Rates (BERs) of DSL systems are typically very low. Conversely, if the received carrier symbol is outside all the circles of radius $5\sigma$ (as is the point marked z in FIG. 3(a)), the decoder 5 assumes that the carrier signal was corrupted in transmission. The value $5\sigma$ is selected so that the BER of the system is maintained at $10^{-7}$.

Occasionally, a stationary noise outlier may send a carrier symbol outside the circle. However, since the BER is low, this will happen very infrequently. When an erroneous symbol is detected, the decoder 5 leaves the correction task to the RS decoder 7 by either not taking any action (i.e. by still outputting the identified constellation point, as if it were reliable) or by erasing the bytes that the symbol affects.

Conversely, when Impulse Noise or RFI is superimposed on the received carrier symbols, a significant number of received carrier symbols will be outside the $5\sigma$ circles. This is a clear indication that a high energy disturbance has occurred. Suppose that only Impulse Noise affects transmission. Then, when a noise burst appears, multiple tones in a DMT symbol may be corrupted. The system may then treat the Euclidean distance information about the carrier symbols in any of various ways. The most conservative approach would be to erase all the bytes belonging to a DMT symbol when the number of carrier symbols with large Euclidean distances within that DMT symbol exceeds some threshold. This approach could be easily applied to systems that are designed to provide protection against worst-case Impulse Noise, and therefore employ a large interleaver depth that is based on the assumption that Impulse Noise can result in the corruption of most symbols in a DMT symbol. Another approach would be to only erase the bytes corresponding to carrier symbols whose Euclidean distance exceeds a certain threshold. The only risk is that, in this case, one or more received carrier symbols may have been driven by the noise close to another constellation symbol and falsely appear to be correct. However, for low BERs, this is very rare. Moreover, even if the bytes corresponding to the erroneous symbols are not erased, they would have to fall within a RS block with many erased bytes in the de-interleaved stream in order for the RS decoder to produce an incorrect codeword. Finally, an intermediate approach could use some smoothing algorithm that erases bytes depending on the pattern of Euclidean distances over a DMT symbol.

When RFI is also present on DSL system, a decision should be made concerning whether a given DMT symbol is affected by RFI only or by Impulse Noise as well. In the latter case, the entire DMT symbol should be marked are being erroneous only if it is certain that the whole DMT symbol is subject to Impulse Noise. Otherwise, only the bytes affected by RFI should be erased, to avoid exceeding the number of maximum number of erasures in each RS codeword at the deinterleaved buffer. In DMT-based DSL systems, the decision can be based on the number of carrier symbols with large Euclidean distances, and their location in a DMT symbol. For example, since the tones affected by RFI are the same between consecutive DMT symbols, noting whether a given tone is far from a constellation point in consecutive DMT symbols allows for a more reliable decision about whether that tone is subject to RFI. More specifically, if the tones with large Euclidean distances form relatively small groups whose location does not change between consecutive DMT symbols, it is almost certain that only RFI is present in the system.

Whereas in the discussion above the decoder 5 effectively derives a binary value indicative of corruption (e.g. a decision is made whether a given symbol is corrupt or not), as discussed above the decoder 5 may alternatively output a flag value which takes more than 2 values (e.g. in respect of each symbol for example). For example, it may be a signal value specified by a byte of data. The flag value might, for example, be a representation (e.g. an 8-bit representation) of the total Euclidean distance for the symbol derived as explained above, which functions as a corruption likelihood measure.

2.2 Operation of the Decoder 5 in the Case that the Encoder 3 Performs Convolutional Encoding As mentioned above, a Viterbi decoder evaluates a reliability metric to decode the received carrier symbols. The metric indicates the cost of the surviving sequences when maximum-likelihood sequence detection (MLSD) is implemented using the Viterbi algorithm. In the absence of noise, there will be a sequence with significantly lower metric compared to the others in the case of MLSD.

Denote the i-th observation by $y_i$, and the possible values of the noise-free received signal by $x_{l,j}$ where $l=1,\ldots,16$ are the 16 possible trellis states and $N_0/2$ is power spectral density of AWGN. Denote the probability given $y_i$ of the hypothesis that the noise-free received signal is $x_{l,i}$ by $p_l(y_i)$. Assuming that each noise-free received signal $x_{l,i}$ is independent and equally likely to be received, the likelihood function of state l, based on the MLSD at the G-th stage of the trellis is:

$$p_l = \frac{1}{(\pi N_0)^{G/2}} \exp\left(-\frac{\sum_{i=0}^{G-1}(y_i - x_{l,i})^2}{N_0}\right) \quad l=1,\ldots,16 \qquad (8)$$

Let $$M_l = \sum_{i=0}^{G-1}(y_i - x_{l,i})^2 \quad l=1,\ldots,16 \qquad (9)$$

represent the 16 cumulative metrics corresponding to the 16 trellis states obtained at each stage. The probability of making the right decision if the decoder selects $x_{j,i}$ is thus:

$$p_{j,correct} = \frac{\exp(-M_j/N_0)}{\sum_{l=1}^{16} \exp(-M_l/N_0)} \quad j=1,\ldots,16 \qquad (10)$$

Let $\Delta_{i,j=(M_i-M_j)}/N_0$ denote the scaled difference between the metrics. The probability of the decoder making the wrong decision if the decoder selects $x_{j,i}$ is thus:

$$p_{j,error} = 1 - p_{j,correct} \qquad (11)$$
$$= 1 - \frac{1}{1 + \sum_{l=1,l \neq j}^{16} \exp(-(M_l - M_j)/N_0)},$$
$$j = 1, \ldots, 16$$

Since the exponent decreases very quickly as a function of its argument, the sum of the exponentials in the denominator of Eqn. (9) is dominated by the smallest $\Delta_{i,j}$ which is denoted by $\Delta_j$. Accordingly:

$$p_{j,error} \approx 1 - \frac{1}{1 + \exp(-\Delta_j)}, j = 1, \ldots, 16 \qquad (12)$$

The decoder 5 uses the value of $p_{j,error}$ to determine the integrity of the decoded signals. If $\Delta_j$ is small, then $p_{j,error}$ is nearly 0.5, indicating the probability of an error is about 50%. On the other hand, if $\Delta_j$ is large, then $p_{j,error}$ rapidly approaches zero and the likelihood of making an error becomes almost zero.

Consider the sequence of received constellation values from the QAM decoding as a vector in a multidimensional space. A sphere can be defined with a predetermined radius r and a centre at a hypothetical vector $V_0$ which is defined as the vector leading to the minimum value of $M_j$. The reliability of $V_0$ depends on the locations of the remaining hypothetical vectors. The decoder 5 determines whether at least one of the other hypothetical vectors falls within the sphere. If not, the decoder 5 concludes that $V_0$ is reliable and the data decoded using $V_0$ is probably correct. On the other hand, if at least one of the other hypothetical vectors falls within the sphere, the decode 5 concludes that $V_0$ is unreliable. The parameter r is thus a threshold for defining the confidence level required before the given hypothetical vector $V_0$ is accepted.

Another way for the decoder 5 to determine the reliability of the reliability of the decoded signals is directly based on a calculation of $p_{j,error}$, as determined by the output of an iterative algorithm, of the kind used to decode Turbo-codes.

For example, the basic idea of Viterbi decoding for the ADSL/VDSL TCM is to sum up all the Euclidean distances of every received constellation symbol in a DMT frame based on four different closest hypothetical constellation points. From the trellis structure of the TCM, 16 possible states are possible at each stage. The Euclidean distances are summed up in such a way that the total still conforms to the trellis structure, and just one survival path out of the four possible paths leading to the same state is picked based on the metric value.

After the processing at every stage of the trellis, 16 metrics, $M_1, \ldots, M_{16}$ defined in Eqn. (9) would be generated. However, to simplify the computational effort without a significant penalty in the performance, the absolute distance $|y_i - x_{i,j}|$ may be used instead in a hardware implementation. The best survival path at each given trellis stage is the path (out of the 16 states leading to that given state) which has the smallest metric value. The second best survival path is the path (out of the 16 states leading to that given state) with the second smallest value. The value of $\Delta_j$ can be obtained easily by taking the difference between these two metric values. If $\Delta_j$<r,
then the second survival path falls inside the reliability sphere (so that the best survival path leads to an unreliable decoding), while if $\Delta_j$>r it falls outside.

Occasionally, a stationary noise outlier may cause the MLSD path metrics to diverge. However, in the MLSD case, the survival path will converge again if the trellis depth is sufficiently large. In this case, most likely the Viterbi or RS decoder will correct the error.

When an impulse noise burst appears, it will typically cause more than one DMT symbol error on the interleaved stream. Moreover, some of the received symbols will typically be very far from the originally transmitted ones due to the relatively high energy of impulse noise compared to the stationary interference. Therefore, the costs of all of the surviving paths will increase. This implies that the vector $V_0$ will be brought closer to the other vectors. When the decoder notices such persistent effects for a number of received carrier symbols, it is almost certain that a high-energy disturbance has appeared and that most probably it cannot be corrected by the Viterbi decoding. The decoder 5 keeps track of the number of such phenomena in each DMT symbol in order to conclude whether the DMT symbol is affected by impulse noise.

The DMT spectrum is divided into multiple frequency bands for VDSL. Hence, if tone order is limited to particular bands, this will limit the dispersion of the noise across the full spectrum. A Viterbi algorithm in each band may be used to provide erasure information and hence have better protection and noise rejection.

In Viterbi decoding, the survival path is chosen as the path which has the lowest metric, the other paths have larger metrics compared to the survival path in a Gaussian noise scenario. However, when impulse noise impacts on the DSL system, all the path metric values are of the same order of magnitude for a substantial number of trellis stages, so selecting the survival path become very difficult. In this case, that particular DMT symbol is marked as corrupted by impulse noise. In this case, decoder 5 outputs this information to the identifier unit 8, which uses the interleaver mapping function to determine the addresses of the unreliable decoded information within the data transmitted to the RS decoder unit 7 by the de-interleaver unit 6.

Thus, erasures can be provided to the RS decoder 7 by monitoring the output metrics of the viterbi decoder 5. When the difference between the minimum Viterbi path metric and the next smallest metric is large for most stages in one DMT symbol, the whole DMT symbol has not been corrupted by impulse noise, and no bytes are erased. However, when the path metric differences of the Viterbi decoder exceed some threshold value the DMT symbol is marked as corrupted.

The selection of threshold value is very important in this case; otherwise the DMT symbol may be over-marked. Normally, the differences between metrics of best survival path and second best survival path are quite large when the system is not impacted by impulse noise, but they become very small when it is impacted by impulse noise. The selection of the threshold for a given DMT symbol is done in following manner using a counter value initially set to zero:

1. The decoder 5 chooses the best survival path and the second best survival path.

2. For each stage, the decoder 5 computes a measure of the difference between the metrics of these two paths, and if this difference is below some threshold value (such as a threshold at which Viterbi decoding cannot be performed), then a counter value is incremented. The distance measure used is preferably the absolute distance, though in principle Euclidean distance could be used.

3. If the accumulated counter value for a whole DMT symbol exceeds a threshold value, such as a value at which Viterbi decoding cannot be performed well, then a DMT symbol is marked as corrupted.

The optimal threshold value to use in step 3 may be exponentially different in different embodiments which use different data rates. This is because the Viterbi decoding performances may be so different.

Figure 3B:
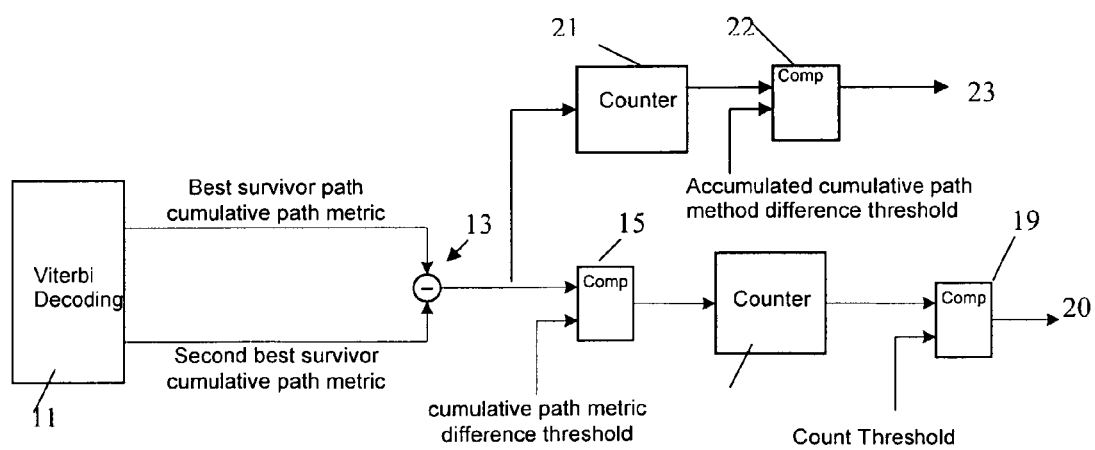

The structure of the decoder unit 5 may be as shown in FIG. 3(b). There is a unit 11 which performs Viterbi decoding to produce two outputs, representing the best and second best survival paths. The difference between them is found by a subtraction unit 13. This difference is compared with a threshold by a first comparator 15. If the difference is above the threshold, the counter 17 is updated. A second comparator 19 determines whether the counter is above or below a second threshold. If so, an output signal 20 is produced indicating corruption.

Optionally, the decoder unit may contain a path (the upper right part of FIG. 3(b) in which an accumulator 21 accumulates the metric differences over the whole DMT symbol, and a comparator 22 compares this to a second threshold ("accumulated threshold") to form another INP indication 23. This option produces an averaging effect which may lead to high precision, but needs a high-order accumulator which increases complexity.

The path metric difference may be used to detect RFI as well. In this case, the method typically does not increment a counter value for each of a number of stages, but rather notes in which stage the poor data integrity is determined. If for a given tone, the path difference metric at a particular stage is poor (i.e. small) for every DMT symbol then this is a strong indication that there is RFI at that tone.

Whereas in the discussion above, the decoder 5 effectively derives a binary value indicative of corruption (e.g. a decision is made whether a given symbol is corrupt or not), as discussed above the decoder 5 may alternatively output a flag value which takes more than 2 values (e.g. in respect of each symbol for example). For example, it may be a signal value specified by a byte of data. The flag value might, for example, be a representation (e.g. an 8-bit representation) of the output of the accumulator 21, which functions as a corruption likelihood measure.

3. Operation of the Identifier Unit 8

As explained above, in the embodiment of FIG. 1, the identifier unit 8 receives information that one or more bytes of a certain DMT symbol is corrupt. Assuming that the interleaver uses the interleaving scheme defined by Eqn. (4), the embodiment first obtains the following parameters:

1. The identifier unit 8 calculates the number of possible codewords S in this DMT symbol. That is given in eqns. (3) and (6).

2. The identifier unit 8 also calculates the number of DMT Symbols are needed for one interleaved Codeword. This value is defined by number of bytes in the interleaver delay divided by number of bytes in one DMT symbol.

$$S\_delay = \left\lceil \frac{MI(I-1)}{(L_p/8)} \right\rceil$$

3. The identifier unit 8 also calculates the number of Possible Codewords in this interleaver delay, which is given by MI(I−1)/N=M(I−1)/q.

One codeword is divided into q interleaver blocks, where each interleaver block has I bytes numbered from 0 to I−1. For a given codeword, the N=qI bytes of the interleaved data which receive the respective bytes of the codeword are denoted by:

First Interleaver Block: $[B_0 B_1 B_2 B_3 \ldots B_{I-1}]$

Second Interleaver Block: $[B_I B_{I+1} B_{I+2} B_{I+3} \ldots B_{2I-1}]$ $\ldots$ qth Interleaver Block: $[B_{(q-1)I} B_{(q-1)I+1} B_{(q-1)I+2} \ldots B_{qI-1}]$ The addresses of the I bytes of the First Interleaver Block data in the interleaved data may be denoted by $A_{B_0}, \ldots, A_{B_{I-1}}$, the addresses of the I bytes of the second interleaved Block data by $A_{B_I}, \ldots A_{B_{2I-1}}$, and so on up to the addresses of the I bytes of the qth interleaved Block data by $A_{B_{(q-1)I}}, \ldots, A_{B_{qI-1}}$.

$[A_{[B_j]}, k]$ indicates an address, where $B_j$ is location of the j-th byte of the codeword before interleaving, and k is the location of corresponding byte inside the memory of the interleaver 2, that is, the address within the interleaved data.

For the First interleaver block, the $[A_{[B_j]}, k]$ are given by $$[[A_{B_0}, 0], [A_{B_1}, MI+1], [A_{B_2}, 2MI+2], [A_{B_3}, 3MI+3], \ldots \\ [A_{B_{I-1}}, MI(I-1)+I-1]] \quad (13)$$

For the Second interleaver block, the $[A_{[B_j]}, k]$ are given by:

$$[[A_{B_I}, I], [A_{B_{I+1}}, MI+I+1], [A_{B_{I+2}}, 2MI+I+2], \ldots [A_{B_{2I-1}}, \\ MI(I-1)+I+I-1]] \quad (14)$$

And so on, until for the q-th interleaver block the $[A_{[B_j]}, k]$ are given by:

$$[[\ldots A_{B_{(q-1)I}}, (q-1)I], [A_{B_{(q-1)I+1}}, MI+(q-1)I+1], \ldots, \\ [A_{B_{qI-1}}, MI(I-1)+(q-1)I+I-1]] \quad (15)$$

Similarly, the interleaver 2 interleaves the data for different codewords. Each boundary between two codewords occurs at a multiple of N=qI bytes.

After decoding of the interleaved data, the location of the bytes for each of p codewords in the DMT symbols are given by:

1st Codeword: (16)

$$\begin{bmatrix} [A_{B_0}, 0], [A_{B_1}, I], \ldots, [A_{B_{(q-1)I}}, (q-1)I], [A_{B_1}, MI+1], \ldots, \\ [A_{B_{I-1}}, MI(I-1)+I-1], \ldots \\ \ldots [A_{B_{qI-1}}, MI(I-1)+(q-1)I+I-1] \end{bmatrix}$$

2nd Codeword: (17)

$$\begin{bmatrix} [A_{B_{qI}}, qI], [A_{B_{I+qI}}, qI+I], \ldots, [A_{B_{(q-1)I+qI}}, (q-1)I+qI], \\ [A_{B_{I+qI}}, MI+qI+1], \ldots, \\ [A_{B_{qI-1+qI}}, MI(I-1)+(q-1)I+qI+I-1] \end{bmatrix}$$

…… p-th Codeword: (18)

More generally, for

the address of the byte

for the p-th codeword is given by:

         (19)

where p is the codeword index, and D is the interleaver depth

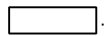.

Thus, given m and n values for the p-th codeword, the corresponding exact byte location in a DMT symbol can be derived. The task of the identifier unit 8 is to reverse this process, and using the byte location of a corrupt byte in a DMT symbol to find the corresponding exact byte location in a particular codeword, so that this corrupt byte can be marked as such during the RS decoding.

For example, consider a case where M=8, N=144, q=3, I=N/q=48, Interleaver depth D=MI+1=385.

| M | N | Byte location in interleaved data [MI + 1](m − 1) + (n − 1)I | Byte location in de-interleaved data [(n − 1)I + (m − 1)] |
|---|---|---|---|
| 1 | 1 | 0 | 0 |
| 1 | 2 | 48 | 48 |
| 1 | 3 | 96 | 96 |
| 2 | 1 | 385 | 1 |
| 2 | 2 | 433 | 49 |
| 2 | 3 | 481 | 97 |
| 3 | 1 | 770 | 2 |
| 3 | 2 | 818 | 50 |
| 3 | 3 | 866 | 98 |

The number of *DMT* symbols needed for one codeword $= (MI(I − 1) + N − 1)/\text{(bytes in } DMT \text{ symbol)}$ $= ((8 * 48 * 47) + 143)/3125 = 5\text{-}6 \text{ symbols}$ Based on equation (19), at the start of the transmission, the byte locations for first codeword in DMT symbols are given by:

1. P=1, and an n value from 1 to q
m=1 {0,48,96},
m=2 {385,385+I,385+2I},
m=3 {2MI+2, 2MI+I+2,2MI+2I+2},
...
m=I {(I−1)MI+I−1,(I−1)MI+I+I−1,(I−1)MI+2I+I−1}

Similarly, the byte locations for the second codeword are given by:

2. P=2 (second codeword) and n from 1 to q
m=1 {qI, qI+I,qI+2I} ...
m=I{[qI+MI(I−1)][qI+MI(I−1)]+I[qI+MI(I−1)]+2I}
...
...

3.1 Operation of the Identifier Unit 8 in the Case that the Decoder 5 has Detected RFI In the RFI case, the affected tones are known. Based on the bit allocation table (which in a DMT system describes, for each tone, how many bits of data are encoded in that tone in one symbol) and the tone reordering table (which indicates which tones carry what data), which bytes are corrupted can be computed if these tones are corrupted. The same process may be performed for the tones which are the harmonics of the corrupted tones. The next task is to find out the mapping for these bytes to corresponding their codewords and their m and n values.

At the start of the transmission, the codeword index is derived and the m and n values for corrupt bytes are derived, so that the affected codeword and bytes are derived. Once the codeword is known and m and n values for first DMT symbol, or the first few DMT symbols, then, with information about any byte offset, the codeword index and byte locations can be pre-computed for the next DMT symbols and pass it RS decoder.

For the problem of finding the byte locations of codewords in the first DMT symbol(s) which are affected by RFI, for each DMT symbol, the identifier unit 8 computes the corrupt byte locations of each of the S codewords in the DMT symbol based on the tones subject to RFI and the bit allocation tables, and then calculates the corresponding codeword's byte location after deinterleaving based on m and n values. The identifier unit 8 then passes this information to RS decoder. In this scenario, there are a maximum 16 possible erasure locations in one RS codeword and each erasure location can take value from 0 to 255, so a maximum of 16*8=128 bits are required to represent these locations for each codeword.

3.2 Operation of the Identifier Unit 8 in the Case that the Decoder 5 has Detected Impulse Noise RS decoding (DeFramer/De-interleaving) starts when Viterbi decoding and QAM demodulation (QT) of one DMT symbol is finished. At that stage, the last codeword decoded by RS decoder is known, and which codewords will be available after the QT processing. Two alternative methods can be used by the identifier unit 8 in the case of impulse noise.

Figure 4:
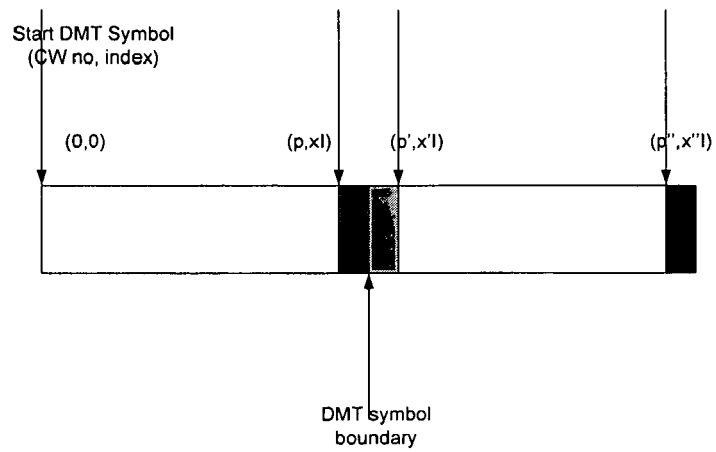
FIG. 4 illustrates an operation performed by one form of an identifier unit of FIG. 2.

Method 1:

To implement this method, the start I boundary of a DMT symbol and end I boundary of the DMT symbol must be known. To represent this, the location of a given byte within the data output by the decoder 5 in the coordinate format (Code Word number, its index) is written, where the index will based on (n−1) I, where n can take value from 0 to q−1. Suppose at the start of the DMT transmission, start I boundary is set at (0, 0). The last I multiple of this DMT symbol must be derived. In FIG. 4, this is denoted as (p,xI). The p and x values must be determined.

CW number (p)=(int) (Number of DMT bytes)/N;
x=(int) (Number of DMT bytes−p*N)/I;

In this way, (p, xI) values are derived. The next I multiple value will be the start I boundary (p', x'I) for next DMT symbol as shown in FIG. 4. In this manner, the (p', x'I) is updated for each DMT symbol. To keep the reference value at (p', x'I), the algorithm is derived, which will give the corrupted data in sequence, when DMT symbol is hit by impulse noise.

Figure 5:
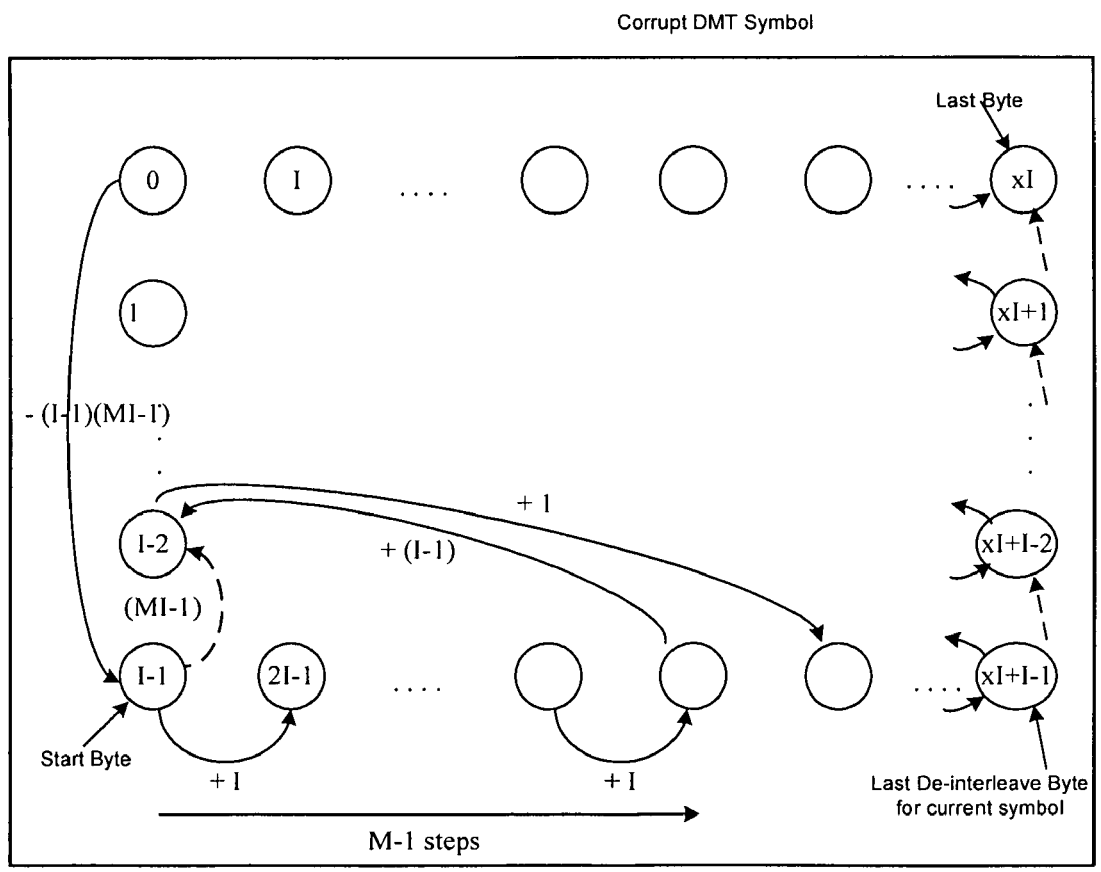
FIG. 5 illustrates a process carried out by the identifier unit of FIG. 2 in performing the operation illustrated in FIG. 4.
Figure 6:
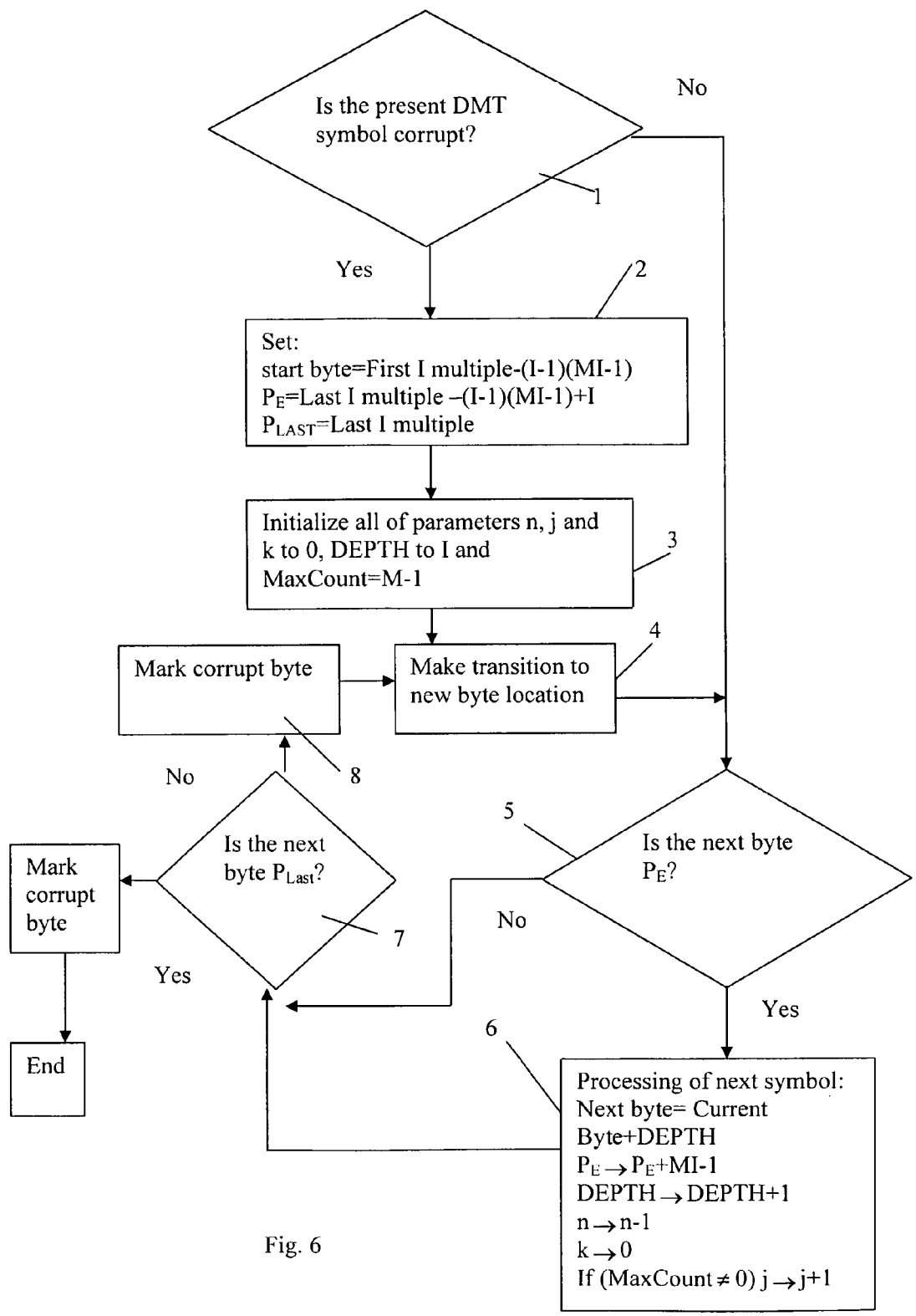
FIG. 6 illustrates a further operation performed by the identifier unit of FIG. 2.

Each Interleaved DMT symbol is segmented into I blocks as shown in FIG. 5. Where each column has I bytes and number of columns (I blocks) are p*q+x, as explained above. The first I multiple byte is located in the first row and first column. The last I multiple byte, which will be first element of last column and will be the last byte belonging to this interleaved corrupt symbol, will be processed by RS decoder. FIG. 5 shows the sequence in which all the bytes are processed by RS decoder. To find the corrupt bytes in a sequence the following procedure is performed, which is shown in FIG. 6. It makes use of parameters called n, j, k, DEPTH, MaxCount, $P_E$ and $P_{Last}$.

Based on impulse noise detection, check whether current Symbol is corrupt or not (step 1).

If the symbol is corrupt, then compute the first de-interleaved byte (Start Byte) in DMT Symbol $\{(I-1)*(MI-1)\}$ and $P_E$ and $P_{Last}$, as defined in the FIGS. 5 and 6 (step 2). $P_E$ is the last de-interleaved byte of the current symbol, and $P_{Last}$ is the last corrupt byte.

Initialize all the parameters (n=0, j=0, k=0, DEPTH=I and MaxCount=M-1) as shown in FIG. 6 (step 3), where I is interleaver block size and M is interleaver block parameter.

Figure 7:
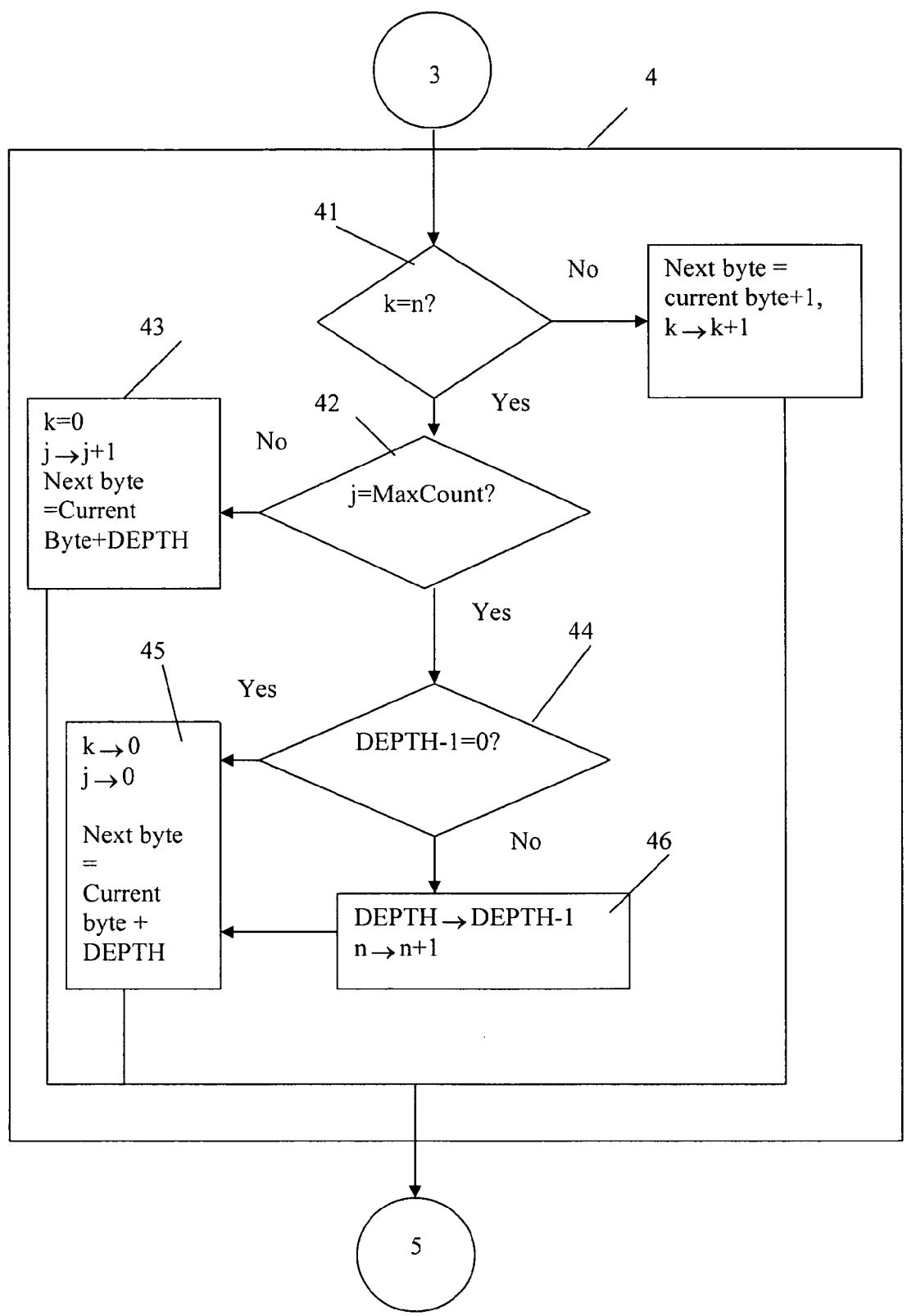
FIG. 7 illustrates a further operation performed by the identifier unit of FIG. 2.
Figure 8:
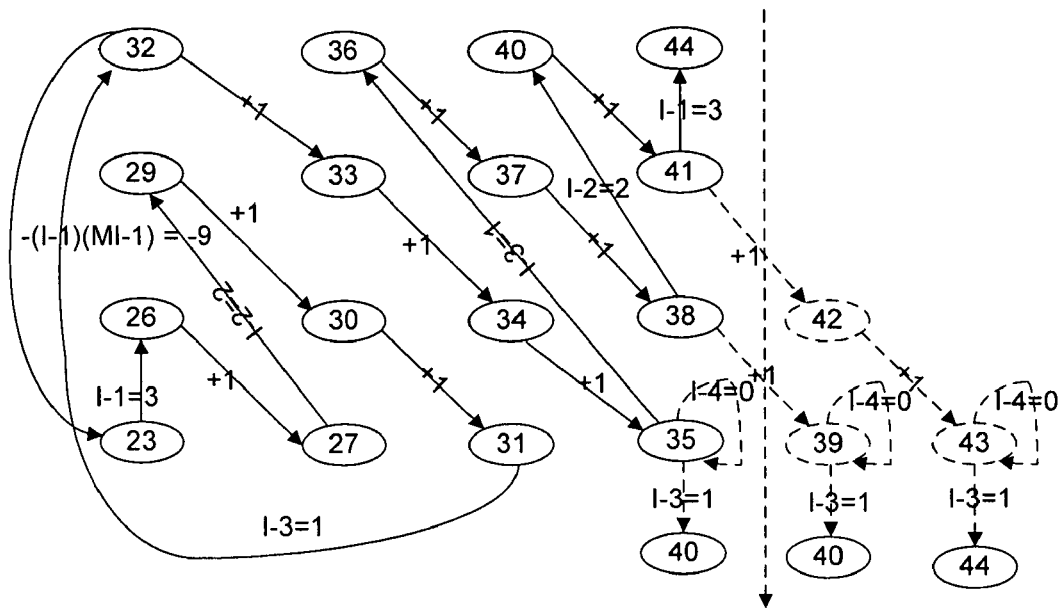
FIG. 8 illustrates a further operation performed by the identifier unit of FIG. 2.
Figure 9:
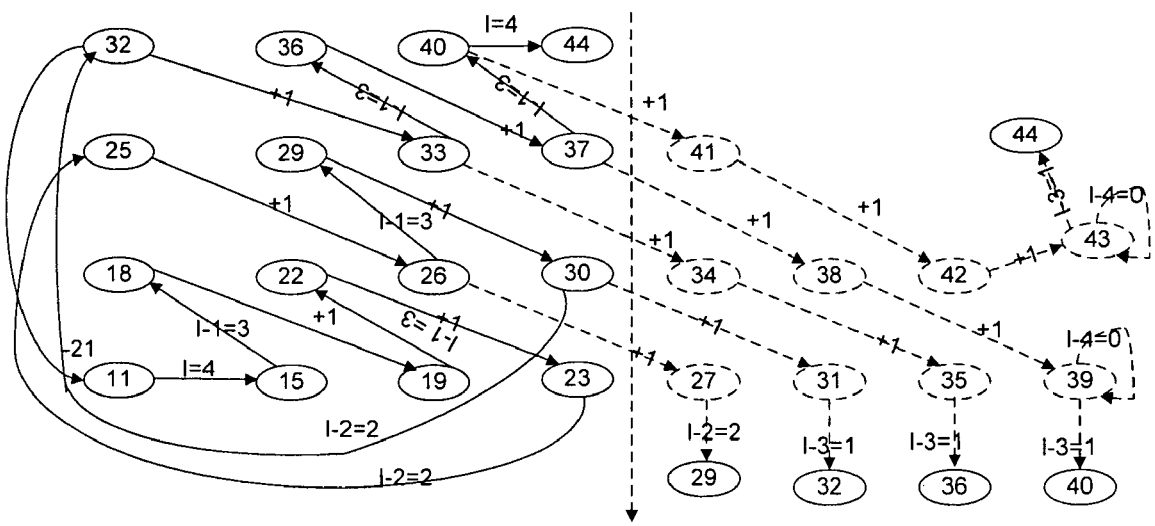
FIG. 9 illustrates a further operation performed by the identifier unit of FIG. 2.
Figure 10:
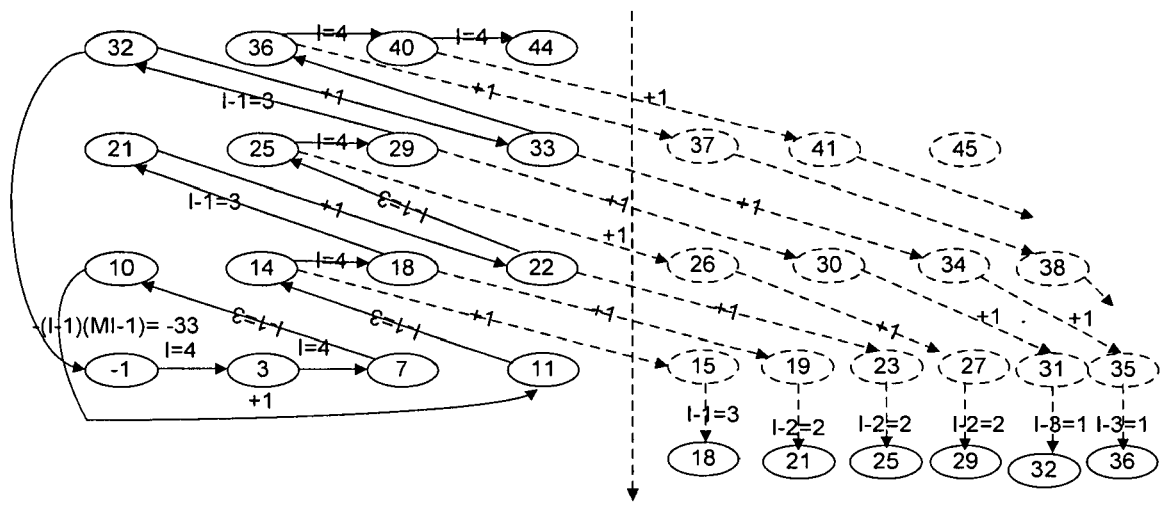
FIG. 10 illustrates a further operation performed by the identifier unit of FIG. 2.

In step 4 the method finds the next byte in the sequence. FIG. 7 illustrates the method. The method uses the three different parameters (n, j, k), which are initialized in step 3 of FIG. 6. Where n can be considered as a vertical movement in a table such as shown in FIGS. 8 to 10 (described below) and the method can take values from 0 to I, j can be considered as horizontal movement and it can take values from 0 to M-1, and k can take values from 0 to n. The method will get the current byte and current values of all the parameters, based on those parameters, the method will generate the de-interleave bytes according to the flowchart given in FIG. 7, which shows the substeps forming step 4. The sub-steps of the flowchart are given below:

1. In step 41 check if (k=n). If this condition is false, then next byte=current byte+1 and k=k+1 and the method will go step 5 as described in FIG. 6.

2. If the previous condition is true, then in step 42 the method will check for (j=Maxcount), which will control the vertical and horizontal movement. If the previous condition is false, then the method will keep going into a horizontal direction, until this condition become true. In step 43, the method will generate Next Byte=Current Byte+DEPTH, j=j+1 and k=0 and then will go to step 5 as described in FIG. 6.

3. If the previous condition (j=MaxCount) is true, then the method will take a vertical step. Before decrementing DEPTH, in step 44, the method will check whether (DEPTH-1)=0 or not. Based on this result, the method will either in step 46 reassign the DEPTH value to DEPTH-1 and n to n+1, or in step 45 the method will generate the Next Byte=Current Byte+DEPTH, k=0, j=0. In either case the method then will go step 5 as described in FIG. 6.

In step 5 it is determined whether the next byte is $P_E$. If not, the method loops back via step 7 as described below. Due to this the procedure will continue until the last de-interleave byte of current symbol is processed ($P_E$), and in step 8 the method will mark each corrupt byte.

If in step 5 the generated byte is equal to $P_E$, that means processing of current symbol is finished and in step 6 the method then computes the parameters for the next symbol as described in the FIG. 6, and the method loops back to repeat the whole procedure until the last interleaved byte of corrupt symbols (Last Byte) is processed.

In step 7 every generated byte from the above step will be compared with the value of the Last Corrupt byte ($P_{Last}$). If this condition is true then the method marks this byte as a corrupt byte and this procedure comes to the end.

In all of these examples, N=8, q=2, I=4 and 16 bytes per DMT symbol.

EXAMPLE 1

M=1, D=5, MI-1=3

Suppose that the third DMT symbol is found to be corrupt (step 1). Consider arranging the 16 bytes of this symbol in the arrangement shown in FIG. 8. In this figure each ellipse indicates one of the bytes of the corrupt symbol. The first I bytes (i.e. the first 4 bytes) are respectively the ellipses in the first column of FIG. 8 (in the vertically descending order). The next I bytes are the ellipses in the second column of the FIG. 8.

The numerical values shown in each of the ellipses show the locations of the bytes in the de-interleaved data. These locations are 32 29 26 23 36 33 30 27 40 37 34 31 44 41 38 35. This data is obtained by direct application of Eqn. (4), for example, but the identifier unit 8 does not have the computing capacity to perform this calculation for general values of the parameters of the embodiment. Instead, the function of the identifier unit 8 is to obtain this data using the following method.

From first principles (e.g. Eqn. (4)), the locations in each row all have the same value of m (in the range 1 to I). Each location is lower by I (i.e. 4) than the location which is to its right.

Furthermore, each value in FIG. 8 is lower by MI-1 (i.e. 3) than the value directly above it.

The location of the left ellipse is the first byte (i.e. n=1, m=1) of the fifth codeword (i.e. p=5), so that its location can be found with low computational cost from Eqn. (19) to be 32. A counter is set to this value (step 2 of FIG. 6).

Thus, the location of the first byte of the DMT symbol, i.e. the byte at the bottom of the left column in FIG. 8, is 32-(I-1)(MI-1), since it is (MI-1) places below the top left ellipse. Thus, its location is 32-9, i.e. 23. The counter is reset to this value (step 2).

The identifier unit 8 then performs the set of steps 3 to 8 which cause the identifier unit 8 to pass from through the ellipses in turn, so as the counter goes through the locations in order. Since a vertical transition increases location by MI-1 (3), and a horizontal transition increases it by 4, a transition which is one-right and one-down increases location by 1. When such a transition is not possible within the diagram, the counter is reset to the next highest position in the left column, or, failing that, to the next position along the top row.

Based on step 4 and the procedure described in FIG. 7, the deinterleaved byte sequence (23 26 27 29 30 31 32 33 34 35 36 37 38 40 41 44) is generated.

To explain this, the Start byte is set to =32-I*(MI-1)=32-9=23 and n=0, j=0, k=0; $P_E$=44-(I-1)*(MI-1)+I=44-9+4=39 and $P_{Last}$=44 and DEPTH=I=4.

1. M=1 and j=0 Next Byte in sequence=23+(DEPTH-1)= 23+4-1=26, n=1, j=0, k=0, DEPTH=3;

2. Next Byte in sequence=26+1=27 (n≠k), n=1, j=0, k=1, DEPTH=3;

3. Next Byte in sequence=27+(DEPTH-1)=27+3-1=29, n=2, j=0, k=0, DEPTH=2;

4. Next Byte in sequence=29+1=30, n=2, j=0, k=1, DEPTH=2;

5. Next Byte in sequence=30+1=31, n=2, j=0, k=2, DEPTH=2;
6. Next Byte in sequence=31+(Step-1)=32, n=3, j=0, k=0, DEPTH=1;
7. Next Byte in sequence=32+1=33, n=3, j=0, k=1, DEPTH=1;
8. Next Byte in sequence=33+1=34, n=3, j=0, k=2, DEPTH=1;
9. Next Byte in sequence=34+1=35, n=3, j=0, k=3, DEPTH=1;
10. Next Byte in sequence DEPTH-1=0, then set DEPTH=1, Next byte=35 DEPTH=35+1=36 n=3, j=0, k=0, DEPTH=1;
11. Next Byte in sequence=36+1=37, n=3, j=0, k=1, DEPTH=1;
12. Next Byte in sequence=37+1=38, n=3, j=0, k=2, DEPTH=1;
13. Next Byte in sequence=38+1=39, n=3, j=0, k=3, DEPTH=1, which is equal to $P_E$, that means that it is end of current symbol processing. A new value for the next symbol is generated.
14. Based on procedure described in FIG. 6, Next Byte=39+1=40, DEPTH=DEPTH+1=2, n=n-1=2, k=0, MaxCount=0=>j=0, $P_E$=42;
15. Next Byte in sequence=40+1=41, n=2, j=0, k=1, DEPTH=2;
16. Next Byte in sequence=41+1=42, n=2, j=0, k=2, DEPTH=2, which is equal to $P_E$, that means that it is end of current symbol processing. A new value for the next symbol is generated.
17. Based on procedure described in FIG. 6, Next Byte=42+2=44, which is the Last corrupt byte and that is the end of processing.

EXAMPLE 2

M=2, D=9, MI-1=7

In this case, the locations are as shown in FIG. 9. By direct application of Eqn. 4, the locations of the corrupted data of the third DMT Symbol are 32 25 18 11 36 29 22 15 40 33 26 19 44 37 30 23. The identifier unit 8 performs the method of FIG. 6, to output the locations in sequence, as 11 15 18 19 22 23 25 26 29 30 32 33 36 37 40 44.

The method finds that the end of a codeword has been reached at locations 15 and 23. That is, it finds that this corrupt symbol includes bytes 11 and 15 of the third codeword, and bytes 18, 19, 22, 23 of the fourth codeword. These two codewords can now be processed by the unit 7. Later codewords can only be processed when the next DMT symbol arrives.

Based on step 4 and procedure described in FIG. 7, deinterleaved byte sequence (11 15 18 19 22 23 25 26 29 30 32 33 36 37 40 44) is generated.

To explain this, Current byte is set to =32-I*(MI-1)=32-21=11 and n=0, j=0, k=0;
1. M=2 and j=0 Next Byte in sequence=11+(4-0)=15, n=0, j=1, k=0;
2. Next Byte in sequence=15+(4-1)=18, n=1, j=0, k=0;
3. Next Byte in sequence=18+1=19, n=1, j=0, k=1;
4. Next Byte in sequence=19+(4-1)=22, n=1, j=1, k=0;
5. Next Byte in sequence=22+1=23, n=1, j=1, k=1;
6. Next Byte in sequence=23+(4-2)=25, n=2, j=0, k=0;
7. Next Byte in sequence=25+1=26, n=2, j=0, k=1;
8. Next Byte in sequence=26+1=27, n=2, j=0, k=2, 27 byte index does not belong to DMT symbol;
9. Next Byte in sequence=27+(4-2)=29, n=2, j=1, k=0;
10. Similarly, it will generate 30, 32, 33, 36 37 40 44 (31, 34, 35, 38, 39, 41, 42, 43 are out of DMT symbol boundary).

EXAMPLE 3

M=3, D=13, MI-1=11

In this case, the locations are as shown in FIG. 10. By direct application of Eqn. 4, the locations of the corrupted data of the third DMT Symbol are 32 21 10 X 36 25 14 3 40 29 18 7 44 33 22 11. Here, the value X indicates an invalid byte location, in which the de-interleaver will send a dummy byte. Thus, in step 2, the counter is set to 32-(I-1) (MI-1)=32-11*3=-1, which is an invalid value. In this case step 1 should be repeated, but starting at the location which is at the top of the next location to the right, i.e. location 32+I=36. Thus, in step 2 the counter should be set to 32-11*3=3.

The identifier unit 8 performs the method of FIGS. 6 and 7, to output the locations in sequence, as X 3 7 10 11 14 18 21 22 25 29 32 33 36 40 44. Similarly, this sequence is generated using step 4 and procedure described in FIGS. 6 and 7.

Method 2

Given eqn. (1), there will be S codewords available for RS decoding after QT processing of one DMT symbol and there are [M(I-1)/q] remaining codewords, which are in the de-interleaver memory, but not ready for RS decoding.

If the DMT symbol is corrupted by the impulse noise, firstly the erased byte locations of S codewords are derived, which are ready for RS decoding. Then the erased byte locations of the remaining [M(I-1)/q] codewords are derived.

1. Find out all the erased byte locations for S codewords.

The codewords are aligned with an (N=qI) boundary. The first codeword after corruption of the whole DMT symbol which is available for RS decoding, will end qI bytes after the last codeword processed in the last DMT symbol in the current DMT symbol. This codeword will have last byte with a distance of qI from the previous codeword, decoded in the last symbol processing. The byte locations of this new codeword inside the qI area are derived.

The location of the first available interleaved codeword in the current DMT symbol with reference to previous codeword is based on eqn. (16):

$$[[A_{B_{qI}}qI], \ldots, [A_{B_{(q-1)I+qI}}qI+(q-1)], \ldots, \ldots [A_{B_{qI-1+qI}}qI+MI(I-1)+(q-1)I+I-1]]$$

and the pth interleaved codeword in current DMT Symbol is based on eqn. (18):

$$[[A_{B_{pqI}}pqI], \ldots, [A_{B_{(q-1)I+pqI}}pqI+(q-1)I], \ldots [A_{B_{qI-1+pqI}}pqI+MI(I-1)+(q-1)I+I-1]]$$

The last byte of the last codeword processed in the previous DMT symbol has a location at MI(I-1)+(q-1)I+I-1=(MI+1)(I-1)+(q-1)I in the interleaver memory.

The first corrupt byte of the pth codeword is derived, which is available in the corrupt DMT symbol and that will calculated based on m and n values which satisfy the condition below:

$$pqI+(MI+1)(m-1)+(n-1)I > x+(MI+1)(I-1)+(q-1)I,$$

where x is remaining number of bytes in the previous DMT symbol, after last codeword processed in previous DMT symbol.

Based on previous equation, $$pqI+(MI+1)(m-1)+(n-q)I-x > 0$$

$$m = \lfloor I-(((p-1)qI+nI-x)/(MI+1)) \rfloor, \quad (20)$$

where n can take values from 1 to q. That means $$\lceil I-((pqI-x)/(MI+1))\rceil \leq m \leq \lfloor I-(((p-1)qI+I-x)/(MI+1))\rfloor,$$

where p is a codeword index ranging from 1 to S and will be available for RS decoding in this DMT symbol and remaining codewords M(I−1)/q are partially filled and decoded in subsequent symbols.

Erasure location information for these S codewords is derived by using equation (20) to RS decoder and storing the information for remaining codewords, which will be processed in subsequent DMT symbols. The erasure locations of S codewords will be computed based on equation (20). The method will be as follows:

1. Find out minimum value of m based on equation (20).
2. Based on m value, get that n value.
3. Based this set of ($m_{min}$, $n_{min}$) values for each codeword, first calculate the bytes of the S codewords at m=$m_{min}$ and the locations of each codeword will be determined by codewords (n−1)I+($m_{min}$−1) and $n_{min} \leq n \leq q$.
4. Compute remaining erased byte locations of each S codewords, based on (n−1)I+(m−1) this equation, where $m_{min}$+1≤m≤I, 1≤n≤q byte locations of remaining codewords, which will be processed in subsequent DMT symbols, are determined by following steps.

Computation of corrupt byte locations of remaining codewords are based on start and end byte location of corrupt DMT symbol. Define lower bound and upper bound of the corrupt symbol as follows:

Lower Bound=x+(MI+1)(I−1)+(q−1)I;
Upper Bound=Lower Bound+Lp;
Lower Bound<pqI+(MI+1)($m^{-1}$)+(n−1)I≤Upper Bound Based on above equation, find the minimum value ($m_{min}$) and maximum value ($m_{max}$) of m for the p-th codeword at which the above conditions are satisfied.

1. At m=$m_{min}$, find the appropriate value of n=$n_{min}$ at which the lower bound is satisfied.
2. At m=$m_{max}$, find the appropriate value of n=$n_{max}$ at which the upper bound is satisfied.
3. Based on this set of ($m_{min}$, $n_{min}$) values for each codeword, first calculate the bytes of the each codeword at m=$m_{min}$ and the location of each codeword will be determined by codewords (n−1)I+($m_{min}$−1) and $n_{min} \leq n \leq q$.
4. Compute the remaining erased byte locations of each codeword are based on (n−1)I+(m−1), where $m_{min}$+1≤m<$m_{max}$,1≤n≤q.
5. Compute the remaining erased byte locations of each codeword based on (n−1)I+(m−1), where m=$m_{max}$, 1≤n≤$n_{max}$.

Consider the same example as discussed earlier in section 3.2, where M=8, N=144, q=3, I=N/q=48, Interleaver depth D=MI+1=385. The data rate equals 100 Mbps.

Assume that the previous DMT symbol ends at Codeword Boundary, so that x=0 and all the calculations are done based on last codeword of the previous DMT symbol. The last interleaved byte that belongs to this codeword=(MI+1)(I−1)+(q−1)I=385*47+2*48=18191 (m=48, n=3)=>last de-interleaved byte for this codeword is (n−1)I+($m^{-1}$)=47+2*48=143.

The number of bytes available in one DMT symbol is = (250*100)/8=3125 bytes.

The number of codewords in one DMT symbol is S=3125/144=(approx) 22 codewords, which can be ready for RS decoding in this DMT symbol.

The number of codewords, which have bytes in this DMT symbol=M(I−1)/q+22=(8*47)/3=147 codewords(approx), out of which around 22 codeword will be ready for RS decoding and rest are partially filled.

1. Consider p=1, where first codeword is ready for RS decoding in this DMT symbol and x=0. By putting the values in the equation (20)

$$m=\lceil 48-48n/385 \rceil$$

where n can take values any values from 1 to 3. In this scenario m=48.

Based on the previous discussion, the location of the byte in interleave data is =qI+(MI+1)(m−1)+(n−1)I. In this case, m=48 and n=1,2,3 (Corrupt bytes location in interleaved DMT symbols are 18239, 18287 and 18335) and corresponding erased bytes are in this codeword are [(n−1)I+(m−1)] (47, 95 and 143).

2. Consider p=2, where the second codeword is ready for RS decoding in this DMT symbol. By putting the values in eqn. (20)

$$m=\lfloor 48-48(n+q)/385 \rfloor,$$

where n can take values any values from 1 to 3. In this scenario, m=48.

Based on the previous discussion, the location of the byte in the interleaved data is =2qI+(MI+1)(m−1)+(n−1)I. In this case, m=48 and n=1,2,3 (Corrupt bytes in DMT symbols are 18383, 18431 and 18479) and the corresponding erased bytes in a codeword are [(n−1)I+($m^{-1}$)] (47, 95 and 143).

3. Consider p=3, where the third codeword is ready for RS decoding in this DMT symbol. By putting the values in the equation (20)

$$m=\lfloor 48-48(n+2q)/385 \rfloor,$$

where n can take values any values from 1 to q=3, m=48−(48(n+6)/385)
n=1, m=48−(48*7/385)=48
n=2, m=48−(48*8/385)=48
n=3, m=48−(48*9/385)=47.

Valid interleaved bytes in this symbol belonging to this codeword can take the following (m,n) values: (47,3),(48,1),(48,2) and (48,3). Corrupt byte locations are 3qI+(MI+1)(m−1)+(n−1)I, (Corrupt bytes in DMT symbols are 18238, 18527, 18575 and 184623) and the corresponding erased bytes in a codeword are [(n−1)I+($m^{-1}$)] (142, 47, 95 and 143).

Similarly, the last codeword processed in this symbol (S=3125/144=21.70) means that p=21. By putting the values inside the equation (20)

$$m=\lceil 48-48(n+20q)/385 \rceil,$$

where n can take values any values from 1 to q=3, m=48−(48(n+60)/385),
n=1, (61*48/385)=7.6=>$m_{min}$=41 and $n_{min}$=1.

Valid interleaved bytes in this symbol belonging to this codeword can take the following (m,n) values: (41,1), (41,2), ... (48,1),(48,2) and (48,3). So corrupt byte locations are 21qI+(MI+1)($m^{-1}$)+(n−1)I, (Corrupt bytes in DMT symbols are 18424, 18472, ..., 21167 and 21215) and the corresponding erased bytes in a codeword are [(n−1)I+($m^{-1}$)] (40, 88, ..., 95 and 143).

These 21 codewords are processed in current DMT symbol processing, and the remaining codewords, which are corrupted by this DMT symbol, will be processed by subsequent DMT symbol processing.

Consider the 22$^{nd}$ codeword, which will be processed in the next symbol:

$$m=\lfloor 48-48(n+21q)/385 \rfloor,$$

where n can take values any values from 1 to q=3, m=48−(48(n+63)/385), n=1, (64*48/385)=7.97=>m=41. In this scenario, $m_{min}=41$ and $n_{min}=1$ and the maximum value of m needs to be derived, so that it cannot exceed the current symbol boundary:

22qI+(MI+1)(m−1)+(n−1)I≦Lp+(MI+1)(I−1)+(q−1)I.

(Lp is the number of bytes in the DMT symbol=3125 Bytes), which results in the below:

$$m=\lfloor 48-(48(n+21q)-3125)/385 \rfloor$$

At n=1, 48*64−3125=−53<0, so n=1 is a valid value. At n=2, 48*65−3125=−5<0, so n=2 is valid value. At n=3, 48*66−3125>0, this byte is outside the corrupt symbol. So (m,n) can take a value from (41,1),(41,2),(41,3), . . . , (48,1) and (48,2). Based on these (m,n), compute all the corrupt bytes.

As described earlier, there will be approximately 125 remaining codewords which are corrupted by this DMT symbol and their processing will be completed in 6-7 DMT symbols. Assume p is the index of the last codeword which is corrupted by this symbol. Their corrupted bytes will be bounded by following equation:

$$x+(MI+1)(I-1)+(q-1)I < pqI+(MI+1)(m-1)+(n-1)I \leq x+(MI+1)(I-1)+(q-1)I+3125$$

In this scenario, first find the maximum value of p, assuming x=0, p=(3125+385*47+2*48)/144=147.36≈147 at m=1, n=1, so the 147$^{th}$ codeword is the last codeword, which is affected by the corrupt DMT symbol, which has a location at 21168 (m=1, n=1) in the interleaved DMT symbol and 0$^{th}$ index in de-interleaved data:

m=1, n=2=>147*144+48=21216<21316((MI+1)(I−1)+(q−1)I+3125);

m=1, n=3=>147*144+96=21264<21316 ((MI+1)(I−1)+(q−1)I+3125);

m=2, n=1=>147*144+385=21553>21316((MI+1)(I−1)+(q−1)1+3125), which is outside the corrupted symbol. So, byte locations in the last codewords are (n−1)I+(m−1)=0, 48 and 96.

Similarly, the corrupt bytes of other codewords can be computed, which will be processed in the next symbol processing.

Although only specific embodiments of the invention are described, many variations of the embodiments within the scope of the invention are possible as will be clear to a skilled reader.

It is therefore intended that the foregoing detailed description be regarded as illustrative rather than limiting, and that it be understood that it is the following claims, including all equivalents, that are intended to define the spirit and scope of this invention.

The invention claimed is:

1. A decoder system that decodes a data signal formed by encoding a first data string by redundancy encoding, interleaving the encoded data string, performing a second level of encoding on the interleaved data string to form an encoded signal, modulating a wave using the encoded signal to form a modulated wave, and transmitting the modulated wave over a data communication path, the system including:
   a demodulation unit operative to receive the modulated wave transmitted over the data communication path and demodulate the modulated wave to form demodulated data;
   a first decoder unit operative to receive the demodulated data, decode the second level of encoding and output a decoded signal and a first error indication signal indicative of the presence of errors in the decoded signal;
   a de-interleaving unit operative to de-interleave the decoded signal to form a de-interleaved signal;
   an identifier unit operative to receive the first error indication signal, and, from the first error indication signal, produce a second error indication signal indicative of the presence of errors in the de-interleaved signal; and
   a redundancy decoder that employs the de-interleaved signal and the second error indication signal to perform redundancy decoding.

2. The decoder system of claim 1, wherein the first error indication signal includes a respective flag value for each of a plurality of components of the decoded signal.

3. The decoder system of claim 2 in which each said flag value comprises a binary value indicative of the presence of an error in the respective component of the decoded signal.

4. The decoder system of claim 2, wherein each said flag value takes one of at least three possible values indicative of relative levels of certainty of the presence of an error in the respective component of the decoded signal.

5. The decoder system of claim 4, wherein each said flag value is specified by at least two bits of data.

6. The decoder system of claim 2, wherein the decoder system is configured to decode a signal transmitted as successive symbols, each symbol encoding multiple bytes of data, each said flag value corresponding to one respective symbol.

7. The decoder system of claim 6, wherein the identifier unit is operative, upon the redundancy decoder receiving a set of bytes obtained from different symbols, to identify to the redundancy decoder the flag values corresponding to the symbols from which the bytes were obtained.

8. The decoder system of claim 6, wherein the identifier unit is operative to employ a mapping logic to identify the bytes of the de-interleaved signal associated with a given one of the symbols.

9. The decoder system of claim 8, wherein the mapping logic comprises at least one state machine.

10. The decoder system of claim 8, wherein the mapping logic comprises at least one mapping table.

11. The decoder system of claim 10, wherein the signal is transmitted as a discrete multi-tone signal comprising multiple tones, the first decoder unit operative to form the first error indication signal as a signal identifying one or more of said multiple tones which are subject to noise.

12. The decoder system of claim 11, wherein the identifier unit is operative to produce the second error indication signal using one or more tables indicating a correspondence between components of the first data string and said multiple tones.

13. The decoder system of claim 12, wherein the tables comprise a table specifying how many bits of data are allocated to each carrier.

14. The decoder system of claim 12, in which the tables comprise a tone reordering table.

15. A method employed by a decoder to decode a data signal formed by encoding a first data string by redundancy encoding, interleaving the encoded data string, performing a second level of encoding on the interleaved data string to form an encoded signal, modulating a wave using the encoded signal to form a modulated wave, and transmitting the modulated wave over a data communication path, the method comprising:
   receiving a modulated wave transmitted over the data communication path;
   demodulating the modulated wave to form demodulated data;
   decoding by way of the decoder the second level of encoding to obtain a decoded signal;

obtaining a first error indication signal indicative of a presence of errors in the decoded signal;

de-interleaving the decoded signal to form a de-interleaved signal;

obtaining from the first error indication signal a second error indication signal indicative of the presence of errors in the de-interleaved signal; and employing the de-interleaved signal and the second error indication signal to perform redundancy decoding.

16. The method of claim 15, wherein obtaining a first error indication signal comprises obtaining a first error indication signal including a respective flag value for each of a plurality of components of the decoded signal.

17. The method of claim 16, wherein each said flag value is a binary value indicative of a presence of an error in a respective component of the decoded signal.

18. The method of claim 16, wherein each said flag value takes one of at least three possible values indicative of relative levels of certainty of the presence of an error in the respective component of the decoded signal.

19. The method of claim 18, wherein each said flag value is specified by at least two bits of data.

20. The method of claim 16, further comprising decoding a signal transmitted as successive symbols, each symbol encoding multiple bytes of data, each said flag value corresponding to one respective symbol.

21. The method of claim 20, further comprising employing a mapping logic to identify the bytes of the de-interleaved signal associated with a given one of the symbols.

22. The method of claim 21, wherein employing the mapping logic comprises employing at least one mapping table.

23. The method of claim 15, wherein the signal is transmitted as a DMT signal employing multiple tones, the first error indication signal being a signal identifying one or more of said tones which are subject to noise.

24. The method of claim 23, further comprising arranging the identifier unit to produce the second error indication signal using one or more tables indicating a correspondence between components of the first data string and said tones.

25. The method of claim 24, wherein the tables comprise a table specifying how many bits of data are allocated to each carrier.

26. The method of claim 24, wherein the tables comprise a tone reordering table.

27. The method of claim 15, wherein the data communication path comprises a wire.

28. The method of claim 27, wherein the transmitted signal is configured to comply with an ADSL standard.

29. The method of claim 27, wherein the transmitted signal is configured to comply with a VDSL standard.

30. The method of claim 15, wherein the data is transmitted in an OFDM standard.

31. An apparatus that decodes a data signal formed by encoding a first data string by redundancy encoding, interleaving the encoded data string, performing a second level of encoding on the interleaved data string to form an encoded signal, modulating a wave using the encoded signal to form a modulated wave, and transmitting the modulated wave over a data communication path, the apparatus comprising:

means for receiving a modulated wave transmitted over the data communication path;

means for demodulating the modulated wave to form demodulated data;

means for decoding the second level of encoding to obtain a decoded signal; and means for obtaining a first error indication signal indicative of a presence of errors in the decoded signal, wherein the means for obtaining a first error signal is configured to:
de-interleave the decoded signal to form a de-interleaved signal;
obtain from the first error indication signal a second error indication signal indicative of the presence of errors in the de-interleaved signal; and
employ the de-interleaved signal and the second error indication signal to perform redundancy decoding.

32. The apparatus of claim 31, wherein the means for obtaining a first error indication signal is further configured to obtain a first error indication signal including a respective flag value for each of a plurality of components of the decoded signal.

33. The apparatus of claim 32, wherein each said flag value is a binary value indicative of a presence of an error in a respective component of the decoded signal.

34. The apparatus of claim 32, wherein each said flag value takes one of at least three possible values indicative of relative levels of certainty of the presence of an error in the respective component of the decoded signal.

35. The apparatus of claim 34, wherein each said flag value is specified by at least two bits of data.

36. The apparatus of claim 32, further comprising means for decoding a signal transmitted as successive symbols, each symbol encoding multiple bytes of data, each said flag value corresponding to one respective symbol.

37. The apparatus of claim 36, further comprising mapping means for identifying the bytes of the de-interleaved signal associated with a given one of the symbols.

38. The apparatus of claim 31, wherein the signal is transmitted as a DMT signal employing multiple tones, the first error indication signal being a signal identifying one or more of said tones which are subject to noise.

* * * * *